United States Patent
Toko et al.

(10) Patent No.: US 11,980,104 B2
(45) Date of Patent: May 7, 2024

(54) MAGNETIC MEMORY DEVICE

(71) Applicant: Kioxia Corporation, Tokyo (JP)

(72) Inventors: Masaru Toko, Kawasaki Kanagawa (JP); Hideyuki Sugiyama, Kawasaki Kanagawa (JP); Soichi Oikawa, Hachioji Tokyo (JP); Masahiko Nakayama, Kuwana Mie (JP)

(73) Assignee: Kioxia Corporation, Tokyo (JP)

( * ) Notice: Subject to any disclaimer, the term of this patent is extended or adjusted under 35 U.S.C. 154(b) by 360 days.

(21) Appl. No.: 17/117,813

(22) Filed: Dec. 10, 2020

(65) Prior Publication Data
US 2022/0085276 A1    Mar. 17, 2022

(30) Foreign Application Priority Data

Sep. 16, 2020    (JP) .................................. 2020-155729

(51) Int. Cl.
| | | |
|---|---|---|
| *H01L 43/02* | (2006.01) | |
| *H10B 61/00* | (2023.01) | |
| *H10N 50/80* | (2023.01) | |
| *H10N 50/85* | (2023.01) | |

(52) U.S. Cl.
CPC ............. *H10N 50/80* (2023.02); *H10B 61/10* (2023.02); *H10N 50/85* (2023.02)

(58) Field of Classification Search
CPC ....... H01L 27/224; H01L 43/08; H01B 61/10; H10N 50/80; H10N 50/85
USPC .............................................. 438/3; 257/295
See application file for complete search history.

(56) References Cited

U.S. PATENT DOCUMENTS

| | | | | |
|---|---|---|---|---|
| 5,930,164 A | * | 7/1999 | Zhu ...................... | G11C 11/5607 365/158 |
| 6,538,297 B2 | * | 3/2003 | Odagawa ................ | G11C 11/16 365/158 |
| 6,641,935 B1 | * | 11/2003 | Li ............................ | G11B 5/84 428/828.1 |
| 6,743,503 B1 | * | 6/2004 | Chen ...................... | C30B 23/02 428/336 |

(Continued)

FOREIGN PATENT DOCUMENTS

JP    2018133422 A    8/2018

OTHER PUBLICATIONS

Takano et al., "Co1-xCrx/Pt multilayers as perpendicular recording media," Journal of Applied Physics 87 (2000) pp. 6364-6366.*

*Primary Examiner* — Jay C Kim
(74) *Attorney, Agent, or Firm* — Holtz, Holtz & Volek PC

(57) ABSTRACT

According to one embodiment, a magnetic memory device includes a magnetoresistance effect element including a first magnetic layer having a variable magnetization direction, a second magnetic layer having a variable magnetization direction, a third magnetic layer having a fixed magnetization direction and a nonmagnetic layer, the first magnetic layer being provided between the second and third magnetic layers, and the nonmagnetic layer being provided between the first and third magnetic layers. The second magnetic layer has a superlattice structure in which first element layers and second element layers are alternately stacked. The first element is Co, and the second element is selected from Pt, Ni and Pd, and the second magnetic layer contains Cr as a third element.

20 Claims, 5 Drawing Sheets

(56) References Cited

U.S. PATENT DOCUMENTS

| | | | | |
|---|---|---|---|---|
| 8,546,896 B2* | 10/2013 | Lottis | | H01F 10/3254 |
| | | | | 257/E29.323 |
| 8,704,319 B2* | 4/2014 | Tang | | H10N 50/10 |
| | | | | 365/158 |
| 8,710,605 B2* | 4/2014 | Takahashi | | H10N 50/85 |
| | | | | 257/E27.005 |
| 8,796,797 B2* | 8/2014 | Doyle | | H01F 10/16 |
| | | | | 365/158 |
| 8,836,061 B2* | 9/2014 | Zhou | | H10N 50/85 |
| | | | | 257/421 |
| 8,988,934 B2* | 3/2015 | Shukh | | H10N 50/10 |
| | | | | 977/935 |
| 9,147,833 B2* | 9/2015 | Pi | | H10N 52/00 |
| 9,178,134 B2 | 11/2015 | Nakayama et al. | | |
| 9,184,374 B2 | 11/2015 | Sawada et al. | | |
| 9,305,576 B2 | 4/2016 | Noma | | |
| 9,306,154 B2* | 4/2016 | Gan | | H10N 50/80 |
| 9,385,304 B2 | 7/2016 | Nakayama et al. | | |
| 9,478,730 B2* | 10/2016 | Chepulskyy | | G11C 11/161 |
| 9,548,441 B2* | 1/2017 | Oguz | | H10N 50/85 |
| 9,570,674 B2* | 2/2017 | Kim | | G11C 11/1659 |
| 9,614,147 B2* | 4/2017 | Park | | H10N 50/10 |
| 9,647,034 B2 | 5/2017 | Nakayama et al. | | |
| 9,755,140 B2* | 9/2017 | Lim | | H10N 50/10 |
| 9,837,468 B2* | 12/2017 | Kim | | H10N 50/10 |
| 9,871,191 B2* | 1/2018 | Zhou | | H10N 50/10 |
| 9,893,121 B2 | 2/2018 | Sonoda et al. | | |
| 9,893,273 B2* | 2/2018 | Hu | | H10N 50/01 |
| 10,008,663 B1* | 6/2018 | Hao | | G11C 11/161 |
| 10,043,966 B2* | 8/2018 | Bak | | H01L 21/768 |
| 10,103,321 B2* | 10/2018 | Kato | | H10N 50/10 |
| 10,170,694 B1* | 1/2019 | Shirotori | | H01L 27/222 |
| 10,319,902 B2 | 6/2019 | Matsumoto et al. | | |
| 10,361,362 B2* | 7/2019 | Gan | | H10N 50/10 |
| 10,541,014 B2* | 1/2020 | Doyle | | G11C 11/1673 |
| 10,573,688 B2 | 2/2020 | Swerts | | |
| 10,692,927 B1* | 6/2020 | Gottwald | | H10B 61/10 |
| 10,707,268 B2* | 7/2020 | Endo | | H10N 50/80 |
| 10,833,253 B2* | 11/2020 | Hu | | H10N 50/01 |
| 11,081,154 B1* | 8/2021 | Xiao | | H10N 50/10 |
| 11,088,200 B1* | 8/2021 | Xiao | | H10N 50/10 |
| 11,177,431 B2* | 11/2021 | Chern | | H01F 41/308 |
| 11,251,367 B2* | 2/2022 | Guo | | H10N 50/10 |
| 11,302,372 B2* | 4/2022 | Woo | | H10N 50/10 |
| 11,450,466 B2* | 9/2022 | Guo | | H01F 10/3286 |
| 2012/0008381 A1 | 1/2012 | Nagase et al. | | |
| 2012/0068284 A1* | 3/2012 | Kitagawa | | H01L 43/08 |
| | | | | 257/E29.323 |
| 2015/0069548 A1 | 3/2015 | Nakayama et al. | | |
| 2015/0069554 A1 | 3/2015 | Nakayama et al. | | |
| 2015/0333254 A1* | 11/2015 | Liu | | G01R 33/098 |
| | | | | 438/3 |
| 2016/0181514 A1 | 6/2016 | Kim et al. | | |
| 2018/0277745 A1* | 9/2018 | Oikawa | | H01L 27/222 |
| 2019/0304521 A1* | 10/2019 | Tahmasebi | | H10N 50/10 |
| 2019/0305213 A1* | 10/2019 | Sun | | H10N 50/80 |
| 2020/0105324 A1 | 4/2020 | Smith et al. | | |
| 2021/0233576 A1* | 7/2021 | Xiao | | H10N 50/85 |

\* cited by examiner

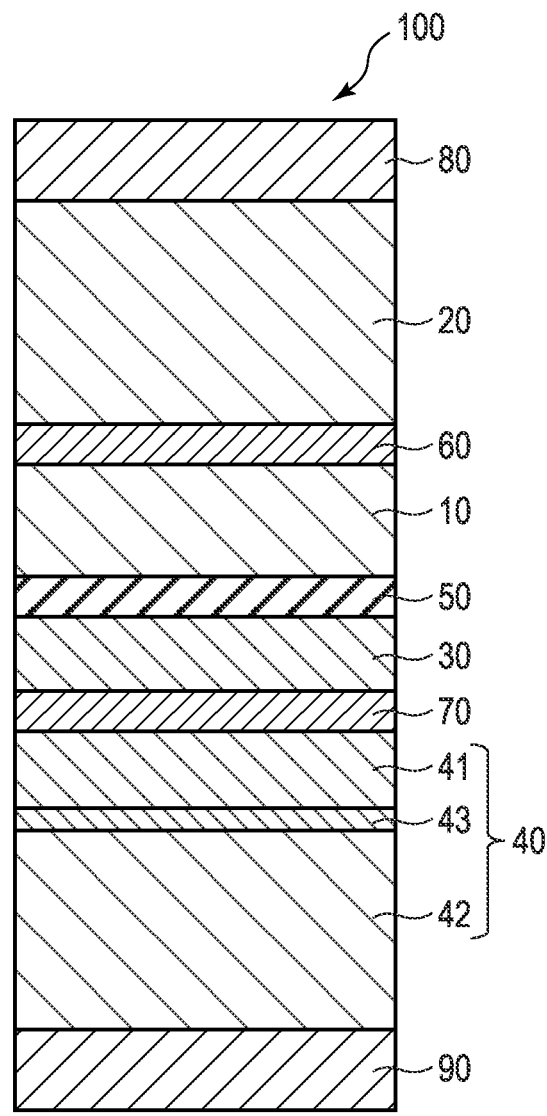
F I G. 1

MAGNETIC MEMORY DEVICE

CROSS-REFERENCE TO RELATED APPLICATIONS

This application is based upon and claims the benefit of priority from Japanese Patent Application No. 2020-155729, filed Sep. 16, 2020, the entire contents of which are incorporated herein by reference.

FIELD

Embodiments described herein relate generally to a magnetic memory device.

BACKGROUND

A nonvolatile magnetic memory device in which magnetoresistance effect elements are integrated as memory elements on a semiconductor substrate is proposed.

BRIEF DESCRIPTION OF THE DRAWINGS

FIG. 1 is a cross-sectional diagram schematically showing a configuration of a magnetoresistance effect element according to an embodiment.

DETAILED DESCRIPTION

Figure 2:
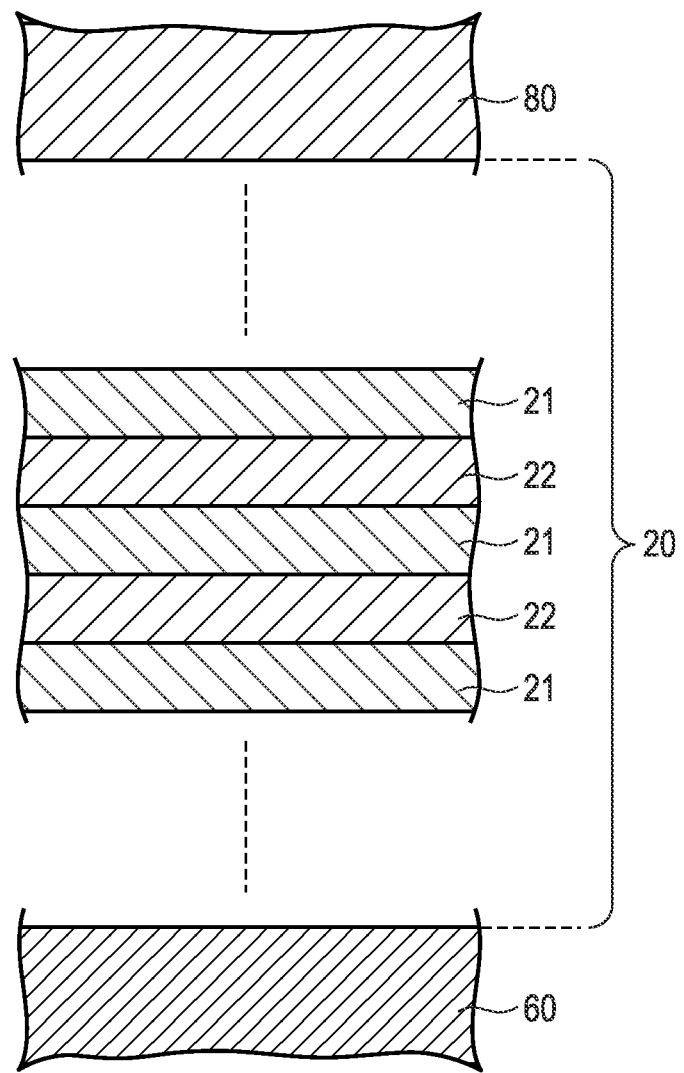
FIG. 2 is a cross-sectional diagram schematically showing a configuration of a second magnetic layer of the magnetoresistance effect element of the embodiment.

In general, according to one embodiment, a magnetic memory device includes a magnetoresistance effect element including a first magnetic layer having a variable magnetization direction, a second magnetic layer having a variable magnetization direction, a third magnetic layer having a fixed magnetization direction and a nonmagnetic layer, the first magnetic layer being provided between the second magnetic layer and the third magnetic layer, and the nonmagnetic layer being provided between the first magnetic layer and the third magnetic layer. The second magnetic layer has a superlattice structure in which first element layers formed of a first element and second element layers formed of a second element are alternately stacked one on another. The first element is cobalt (Co), and the second element is selected from platinum (Pt), nickel (Ni) and palladium (Pd), and the second magnetic layer contains chromium (Cr) as a third element.

Embodiments will be described hereinafter with reference to the accompanying drawings.

FIG. 1 is a cross-sectional diagram schematically showing a configuration of a magnetic memory device (nonvolatile magnetic memory device) according to an embodiment, which is, mere specifically, a cross-sectional diagram schematically showing the configuration of the magnetoresistance effect element of the embodiment. This embodiment describes an example case in which a magnetic tunnel junction (MTJ) element device is applied as the magnetoresistance effect element. In practical situations, a plurality of magnetoresistance effect elements are integrated on a semiconductor substrate.

A magnetoresistance effect element 100 shown in FIG. 1 is provided above a semiconductor substrate (not shown) and comprises a stacked structure including a first magnetic layer 10, a second magnetic layer 20, a third magnetic layer 30, a fourth magnetic layer 40, a tunnel barrier layer (nonmagnetic layer) 50, an intermediate layer 60, an intermediate layer 70, a cap layer 80 and a lower conducting layer 90.

More specifically, in the magnetoresistance effect element 100, the first magnetic layer 10 and the third magnetic layer 30 are provided between the second magnetic layer 20 and the fourth magnetic layer 40, and the first magnetic layer 10 is provided between the second magnetic layer 20 and the third magnetic layer 30, and the tunnel barrier layer (nonmagnetic layer) 50 is provided between the first magnetic layer 10 and the third magnetic layer 30. Further, the intermediate layer 60 is provided between the first magnetic layer 10 and the second magnetic layer 20, and the intermediate layer 70 is provided between the third magnetic layer 30 and the fourth magnetic layer 40. These layers 10 to 70 are located between the cap layer 80 and the lower conducting layer 90.

The first magnetic layer 10 is formed from a ferromagnetic layer having a variable magnetization direction and functions as a part of the storage layer of the magnetoresistance effect element 100. The variable magnetization direction is meant that the magnetization direction changes with respect to a predetermined write current. The first magnetic layer 10 contains at least one of cobalt (Co) and iron (Fe). More specifically, the first magnetic layer 10 is formed of CoFeB containing cobalt (Co), iron (Fe) and boron (B).

The second magnetic layer 20, as well, is formed from a ferromagnetic material having a variable magnetization direction and functions as a part of the storage layer of the magnetoresistarice effect element 100. The magnetization direction of the second magnetic layer 20 changes in the same direction as the magnetization direction of the first magnetic layer 10.

FIG. 2 is a cross-sectional diagram schematically showing the configuration of the second magnetic layer 20.

The second magnetic layer 20 has a superlattice structure in which first element layers 21 formed of a first element and second element layers 22 formed of a second element are alternately stacked one on another. The first element is cobalt (Co), and the second element is platinum (Ft), nickel (Ni) or palladium (Pd). Further, the second magnetic layers 20 contain chromium (Cr) as a third element. A lowermost layer of the second magnetic layer 20 (that is, a layer brought into contact with the intermediate layer 60) may be either one of a first element layer 21 and a second element layer 22. An uppermost layer of the second magnetic layer 20 (that is, a layer brought into contact with the cap layer 80) may be either one of a first element layer 21 and a second element layer 22.

The description provided hereinafter is directed to an example case where the first element is cobalt (Co), the second element is platinum (Pt), the second magnetic layer 20 has a superlattice structure in which the Co layers and the Pt layers are alternately stacked one on another and the superlattice structure contains Cr.

The third magnetic layer 30 is formed of a ferromagnetic material having a fixed magnetization direction and functions as a part of a reference layer of the magnetoresistance effect element 100. The fixed magnetization direction is meant that the magnetization direction does not change with respect to a predetermined write current. The third magnetic layer 30 contains at least one of cobalt (Co) and iron (Fe). More specifically, the third magnetic layer 30 is formed of CoFeB containing cobalt (Co), iron (Fe) and boron (B).

The fourth magnetic layer 40 as well, is formed of a ferromagnetic material having a fixed magnetization direction and has anti-ferromagnetic; coupling. That is, the fourth magnetic layer 40 has synthetic anti-ferromagnetic (SAF) coupling and functions as a part of the reference layer of the magnetoresistance effect element 100. For example, the fourth magnetic layer 40 includes a first layer portion 41 formed from a Co layer or a Co/Pt superlattice layer, a second layer portion 42 formed from a Co/Pt superlattice layer and a third layer portion 43 formed from a ruthenium (Ru) or iridium (Ir) layer, and the first layer portion 41 and the second layer portion 42 are antiferromagnetically coupled with each other through the third layer portion 43.

The tunnel barrier layer 50 is a nonmagnetic layer provided between the first magnetic layer 10 and the third magnetic layer 30, and is formed from an insulating material. The tunnel barrier layer 14 contains magnesium (Mg) and oxygen (O). More specifically, the tunnel barrier layer 50 is formed of MgO.

The intermediate layer 60 is a nonmagnetic layer provided between the first magnetic layer 10 and the second magnetic layer 20, and is formed from a predetermined metallic material. The intermediate layer 60 may be functionalized as a third element-containing layer containing chromium (Cr) as the third element, as will be described later.

The intermediate layer 70 is a nonmagnetic layer provided between the third magnetic layer 30 and the fourth magnetic layer 40 and is formed of a predetermined metallic material (for example, molybdenum (Mo), tantalum (Ta) or tungsten (W) or the like).

The cap layer 60 is a nonmagnetic layer provided on the second magnetic layer 20. The cap layer 30 also has, in addition to the function as the cap layer, a function as the third element-containing layer containing chromium (Cr) as the third element. The cap layer 80 will be described in detail later.

The lower conducting layer 30 is a nonmagnetic layer provided under the fourth magnetic layer 40 and is formed from a tantalum (Ta) layer or the like. The magnetoresistance effect element 100 discussed above is a spin-transfer-torque (STT) magnetoresistance effect element having perpendicular magnetization. That is, the first magnetic layer 10, the second magnetic layer 20, the third magnetic layer 30 and the fourth magnetic layer 40 each has the magnetization direction perpendicular to a surface of the film.

When the magnetization direction of the first magnetic layer 10 is parallel to the magnetization direction of the third magnetic layer 30, the magnetoresistance effect element 100 described above is in a relatively low resistance state, whereas it is in a relatively high resistance state when the magnetization direction of the first magnetic layer 10 is antiparallel to the magnetization direction of the third magnetic layer 30. Therefore, the magnetoresistance effect element can store binary data in accordance with the resistance state (low resistance state or high resistance state). Further, to the magnetoresistance effect element 100, a resistance state (low resistance state or high resistance state) can be set according to the direction of current flowing to the magnetoresistance effect element 100.

According to the present embodiment, a magnetoresistance effect element having low saturation magnetization Mst and high perpendicular magnetic anisotropy can be obtained. Therefore, if microminiaturization and high integration of the integrated circuit are advanced, a magnetoresistance effect element which can stably store data can be obtained. Detailed descriptions thereof will now be provided.

To stably store data in the magnetoresistance effect element, it is important to obtain high thermal stability ΔE. However, as the microminiaturization and high integration of the integrated circuit advances, influence of a stray magnetic field between adjacent magnetoresistance effect, elements increases. Therefore, a high thermal stability ΔE must be maintained while lowering the saturation magnetization Mst, which makes it difficult to obtain a magnetoresistance effect element having high thermal stability ΔE.

In this embodiment, the second magnetic layer 20 having a superlattice structure of the first element layers (for example, Co layers) 21 and the second element layers (for example, Pt layers) 22, contains Cr as the third element. Thus, with use of the second magnetic layer 20 containing Cr, the perpendicular magnetic anisotropy of the second magnetic layer 20 can be raised and therefore, a high thermal stability ΔE can be obtained even if the saturation magnetization Mst is low.

Figure 3:
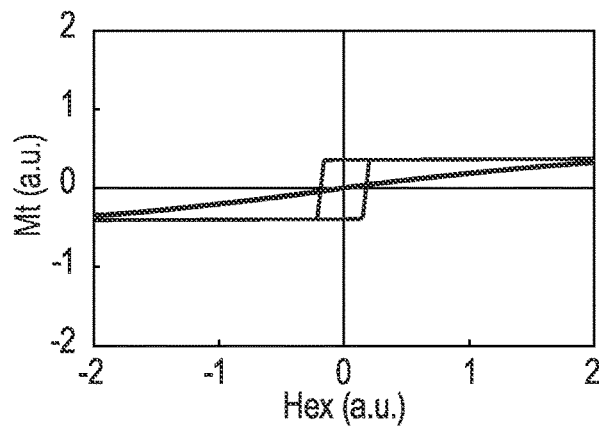
FIG. 3 is a diagram showing magnetic characteristics of a magnetic layer of the magnetoresistance effect, element of the embodiment.
Figure 4:
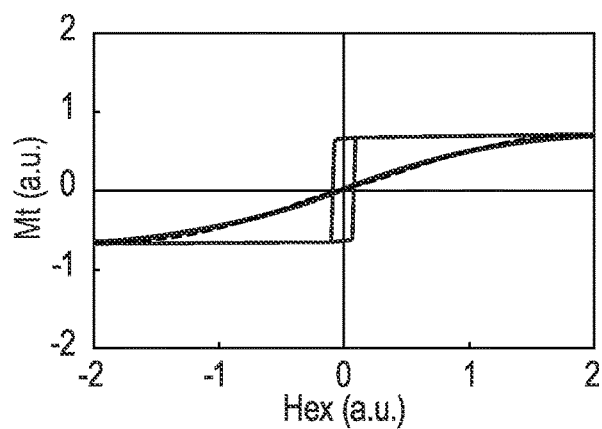
FIG. 4 is a diagram showing magnetic characteristics of a magnetic layer of a magnetoresistance effect element of an comparative example.

FIG. 3 is a diagram showing magnetic characteristics (a relationship between an external magnetic field Hex and a magnetization Mt) of the magnetic layer (a Co/Pt superlattice layer containing Cr) of this embodiment, and FIG. 4 is a diagram showing magnetic characteristics of a magnetic layer (a Co/Pt superlattice layer without containing Cr) of a comparative example. As can be seen from FIGS. 3 and 4, the saturation magnetization is lower in this embodiment (FIG. 3) than in the comparative example (FIG. 4).

Figure 5:
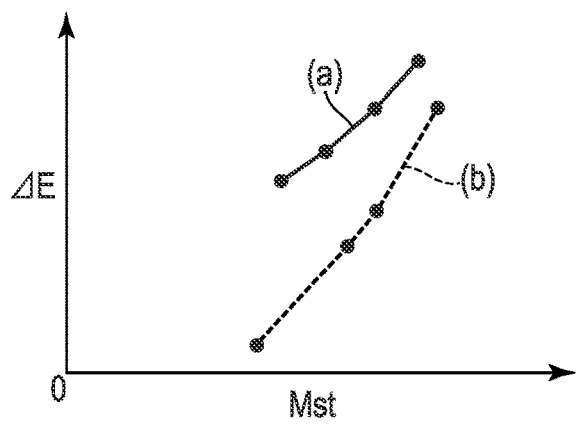
FIG. 5 is a diagram shewing a relationship between a saturation magnetization Mst and a thermal stability ΔE in each of the magnetoresistance effect elements of the embodiment and the comparative example.

FIG. 5 is a diagram showing the relationship between the saturation magnetization Mst and the thermal stability ΔE. The thermal stability ΔE is greatly improved in the case (a) where the magnetic layer (the Co/Pt superlattice layer containing Cr) of this embodiment is used as the second magnetic layer 20, as compared to the case (b) of the comparative example, where a magnetic layer (a Co/Pt superlattice layer which does not contain Cr) is used as the second magnetic layer 20. In other words, in the case of this embodiment, a high thermal stability ΔE can be obtained for a low saturation magnetization Mst.

In this embodiment, as can be seen from FIGS. 3, 4 and 5, with use of the second magnetic layer 20 containing Cr, a magnetoresistance effect element having high thermal stability ΔE can be obtained even if the saturation magnetization Mst is low.

The second magnetic layer 20 containing Cr can be formed by diffusing Cr into the second magnetic layer 20 by heat treatment from the cap layer 30, which is a Cr-containing layer. As described, by diffusing Cr into the second magnetic layer 20 from the cap layer 80, Cr can be contained in the second magnetic layer 20 while the superlattice structure of the second magnetic layer (the Co/Pt superlattice layer) 20 is retained.

Generally, it is difficult to form a Co/Pt superlattice layer having high perpendicular magnetic anisotropy when the second magnetic layer (the Co/Pt superlattice layer) 20 is provided on an upper layer side of the tunnel barrier layer 50. But as in this embodiment, by diffusing Cr into the second magnetic layer (the Co/Pt superlattice layer) 20 from the cap layer 80, Cr can be easily contained in the second magnetic layer 20, thereby making it possible to form the second magnetic layer 20 having high perpendicular magnetic anisotropy.

Examples of the cap layer (the Cr-containing layer) 80 will now be described.

The first example employs a Cr layer containing substantially only Cr (the third element) as the cap layer (the Cr-containing layer) 80.

The second example employs a cap layer (a Cr-containing layer) 30 containing Cr (the third element) and at least; one of elements of Co (the first element) and Pt (the second element). More specifically, in the second example, a CrCo alloy layer, a CrPt alloy layer or a CrCoPt alloy layer is used as the cap layer (the Cr-containing layer) 30.

Note that in each of the first and second examples, the uppermost layer of the second magnetic layer 20 (that is, the layer brought into contact with the cap layer 80) may be either one of a Co layer and a Pt layer.

Note that in this embodiment, to introduce Cr contained in the cap layer 80 into the second magnetic layer 20, the concentration of Cr contained in the cap layer (the Cr-containing layer) 80 is higher than the concentration of Cr contained in the second magnetic layer (the Co/Pt superlattice layer) 20.

Further, along with using such a Cr-containing layer as discussed above for the cap layer 80, such a Cr-containing layer may be used also for the intermediate layer 60. That is, as the intermediate layer (the Cr-containing layer) 60, a Cr layer containing substantially only Cr (the third element) may be used, or an alloy layer containing Cr (the third element) and at least one of Co (the first element) and Pt (the second element) may be used.

Thus, with use of a Cr-containing layer for the intermediate layer 60 as well, Cr can be diffused from the cap layer 60 and the intermediate layer 60, in other words, the upper and lower surface sides of the second magnetic layer 20, and the introduction of Cr into the second magnetic layer 20 can be carried out more effectively. In this case, the concentration of Cr contained in the cap layer (the Cr-containing layer) 80 and the concentration of Cr contained in the intermediate layer (the Cr-containing layer) 60 are both higher than the concentration of Cr contained in the second magnetic layer (the Co/Pt superlattice layer) 20.

Note that the above-provided examples are discussed in connection with an example case where a Co/Pt superlattice layer is used as the second magnetic layer 20, in other words, cobalt (Co) is used as the first element which constitutes the superlattice layer and platinum (Pt) is used as the second element, but an effect similar to that described above can be obtained when using nickel (Ni) or palladium (Pd) is used in place of platinum (Pt) as the second element.

Next, a modified example of this embodiment will be described. Note that the basic items are similar to those of the embodiment provided above and the explanations of those described in the embodiment will be omitted.

Figure 6:
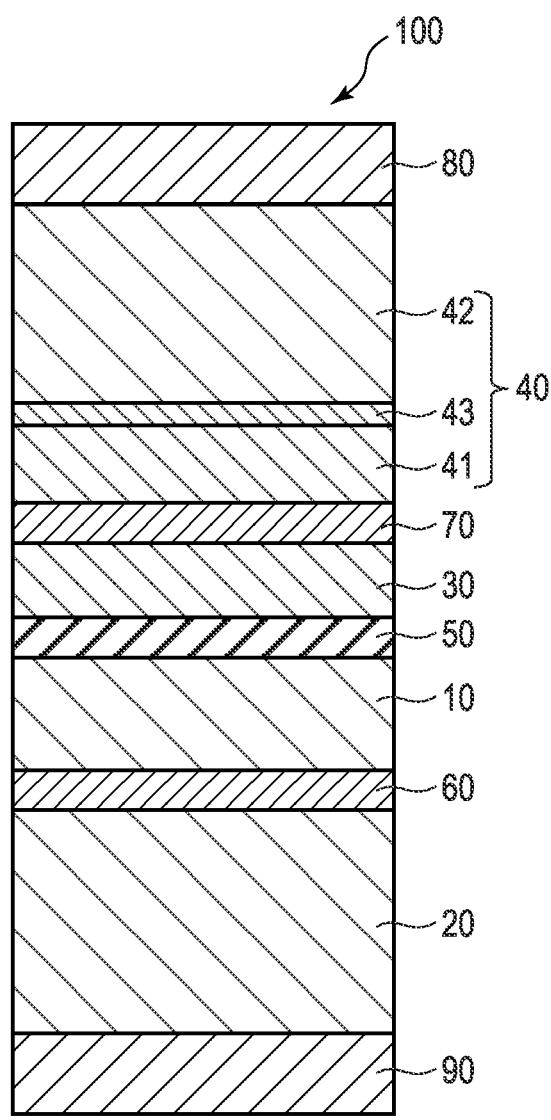
FIG. 6 is a cross-sectional diagram schematically showing a configuration of a modified example of the magnetoresistance effect element of the embodiment.

FIG. 6 is a cross-sectional diagram schematically showing a configuration of a nonvolatile magnetic memory device (a magnetoresistance effect element) according to the modified example.

In the above-provided embodiment, a magnetoresistance effect element (a top-free magnetoresistance effect element) in which a storage layer is located in an upper layer side and a reference layer is located in a lower side is discussed. But, this modified example uses a magnetoresistance effect element (a bottom-free magnetoresistance effect element) in which a storage layer is located in a lower layer side and a reference layer is located in an upper layer side.

In this modified example as well, such a Cr-containing layer as that described in the embodiment is used as the cap layer 30, and such a Cr-containing layer as that described in the embodiment is used as the intermediate layer 60.

In this modified example, Cr contained in the cap layer 80 is diffused into the fourth magnetic layer 40, and thus the perpendicular magnetic anisotropy of the fourth magnetic layer 40 can be improved. Further, Cr contained in the intermediate layer 60 is diffused into the second magnetic layer 20, and thus the perpendicular magnetic anisotropy of the second magnetic layer 20 can be improved. Therefore, in this modified example as well, high thermal stability ΔE can be secured as in the above-described embodiment.

Figure 7:
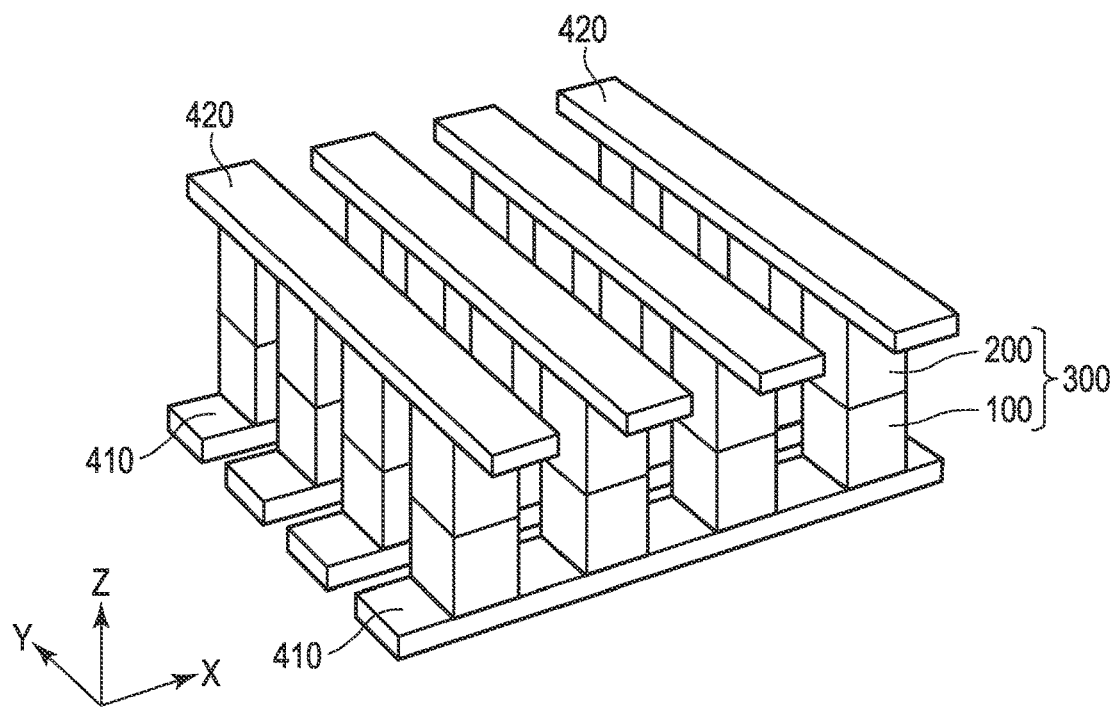
FIG. 7 is a perspective diagram schematically showing an example of the configuration of a magnetic memory device which employs the magnetoresistance effect element of the embodiment.

FIG. 7 is a perspective diagram schematically showing an example of the configuration of the magnetic memory device which employs the magnetoresistance effect element 100 described in the above-described embodiment and the modified example.

The magnetic memory device shown in FIG. 7 comprises a plurality of first wires 410 extending along an X direction, a plurality of second wires 420 extending along a Y direction, and memory cells 300 connected between the first, wires 410 and the second wires 420, respectively. The first wires 410 each correspond to one of a word line and a bit line, and the second wires 420 each correspond to the other. Each of the memory cells 300 comprises a magnetoresistance effect element 100 and a selector (switching element) 200 connected in serial to the magnetoresistance effect element 100.

For the magnetoresistance effect element 100, a magnetoresistance effect element described in the embodiment or the modified example is employed.

For the selector 200, for example, a two-terminal type switching element is used. When the voltage applied between the two terminals is lower than a threshold value, the switching element is in a "high resistance state", that is, for example, an electrically nonconductive state. When the voltage applied between the two terminals is higher than or equal to the threshold value, the switching element is in a "low resistance state", for example, an electrically conductive state.

When a predetermined voltage is applied between a first wire 410 and a second wire 420, connected to a desired memory cell 300, the selector 200 included in the desired memory cell 300 is turned to an ON state (conduction state), and a write or read is carried out to the magnetoresistance effect element 100 included in the desired memory cell 300.

Figure 8:
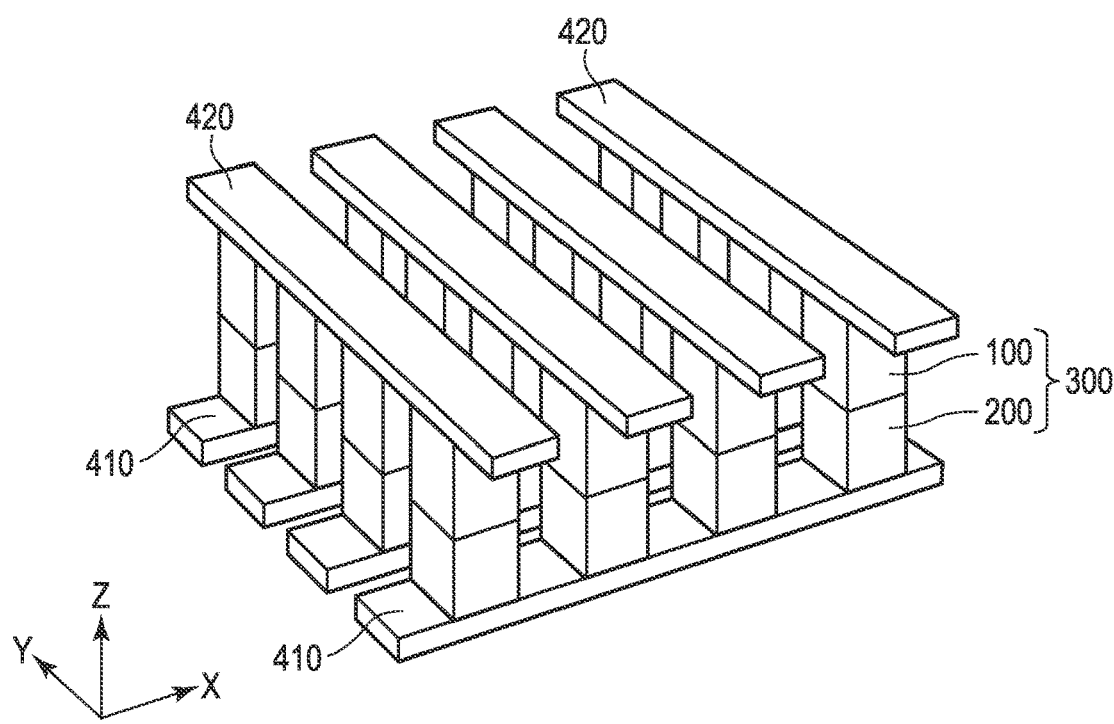
FIG. 8 is a perspective diagram schematically showing another example of the configuration of the magnetic memory device which employs the magnetoresistance effect element of the embodiment.

FIG. 8 is a perspective diagram schematically showing another example of the configuration of the magnetic memory device which employs the magnetoresistance effect element 100 described in the embodiment or the modified example.

In the example shown in FIG. 7, the magnetoresistance effect element 100 is located on a lower layer side and the selector 200 is located on an upper layer side, whereas in the example shown in FIG. 8, the magnetoresistance effect element 100 is located on the upper layer side and the selector 200 is located on the lower layer side. The other basic configuration is similar to that of the example shown in FIG. 7.

When using the magnetoresistance effect element 100 of either one of these examples in the respective magnetic memory device shown in FIG. 7 or 8, a magnetic memory device which can stably store data can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit, of the inventions.

What is claimed is:

1. A magnetic memory device comprising a magnetoresistance effect element including a first magnetic layer having a variable magnetization direction, a second magnetic layer having a variable magnetization direction, a third magnetic layer having a fixed magnetization direction and a nonmagnetic layer, the first magnetic layer being provided between the second magnetic layer and the third magnetic layer, and the nonmagnetic layer being provided between the first magnetic layer and the third magnetic layer,
wherein:
the second magnetic layer has a superlattice structure in which first element layers formed of a first element and second element layers formed of a second element are alternately stacked one on another,
the first element is cobalt (Co), and the second element is selected from platinum (Pt), nickel (Ni) and palladium (Pd),
the second magnetic layer contains chromium (Cr) as a third element,
the magnetoresistance effect element further includes a fourth magnetic layer having a fixed magnetization direction and having anti-ferromagnetic coupling, and
the first magnetic layer and the third magnetic layer are provided between the second magnetic layer and the fourth magnetic layer.

2. The device of claim 1, wherein:
the magnetoresistance effect element further includes a third element-containing layer containing the third element,
a concentration of the third element contained in the third element-containing layer is higher than a concentration of the third element contained in the second magnetic layer, and
the second magnetic layer is provided between the first magnetic layer and the third element-containing layer.

3. The device of claim 2, wherein the third element-containing layer further contains at least one of the first element and the second element.

4. The device of claim 1, wherein:
the magnetoresistance effect element further includes a third element-containing layer containing the third element,
a concentration of the third element contained in the third element-containing layer is higher than a concentration of the third element contained in the second magnetic layer, and
the third element-containing layer is provided between the first magnetic layer and the second magnetic layer.

5. The device of claim 4, wherein the third element-containing layer further contains at least one of the first element and the second element.

6. The device of claim 1, wherein a magnetization direction of the second magnetic layer changes in a same direction as a magnetization direction of the first magnetic layer.

7. The device of claim 1, wherein the magnetoresistance effect element has perpendicular magnetization.

8. The device of claim 1, wherein the first magnetic layer contains at least one of cobalt (Co) and iron (Fe).

9. The device of claim 1, wherein the third magnetic layer contains at least one of cobalt (Co) and iron (Fe).

10. The device of claim 1, wherein the nonmagnetic layer contains magnesium (Mg) and oxygen (O).

11. The device of claim 1, further comprising a switching element connected in series to the magnetoresistance effect element,
wherein the magnetoresistance effect element and the switching element constitute a memory cell.

12. The device of claim 11, wherein:
the switching element is a two-terminal type switching element, and
when a voltage applied between two terminals is less than a threshold, the switching element exhibits a high resistance state, and when a voltage applied between the two terminals is higher than or equal to the threshold, the switching element exhibits a low resistance state.

13. The device of claim 11, further comprising a first wire and a second wire,
wherein the memory cell is connected between the first wire and the second wire.

14. A magnetic memory device comprising a magnetoresistance effect element including a first magnetic layer having a variable magnetization direction, a second magnetic layer having a variable magnetization direction, a third magnetic layer having a fixed magnetization direction and a nonmagnetic layer, the first magnetic layer being provided between the second magnetic layer and the third magnetic layer, and the nonmagnetic layer being provided between the first magnetic layer and the third magnetic layer,
wherein:
the second magnetic layer has a superlattice structure in which first element layers formed of a first element and second element layers formed of a second element are alternately stacked one on another,
the first element is cobalt (Co), and the second element is selected from platinum (Pt), nickel (Ni) and palladium (Pd),
the second magnetic layer contains chromium (Cr) as a third element,
the magnetoresistance effect element further includes a third element-containing layer containing the third element,
a concentration of the third element contained in the third element-containing layer is higher than a concentration of the third element contained in the second magnetic layer,
the second magnetic layer is provided between the first magnetic layer and the third element-containing layer, and
the third element-containing layer further contains at least one of the first element and the second element.

15. The device of claim 14, wherein a magnetization direction of the second magnetic layer changes in a same direction as a magnetization direction of the first magnetic layer.

16. The device of claim 14, wherein the magnetoresistance effect element has perpendicular magnetization.

17. The device of claim 14, wherein the first magnetic layer contains at least one of cobalt (Co) and iron (Fe).

18. The device of claim 14, wherein the third magnetic layer contains at least one of cobalt (Co) and iron (Fe).

19. The device of claim 14, wherein the nonmagnetic layer contains magnesium (Mg) and oxygen (O).

20. The device of claim 14, further comprising a switching element connected in series to the magnetoresistance effect element,
   wherein the magnetoresistance effect element and the switching element constitute a memory cell.

\* \* \* \* \*